United States Patent [19]

Fu et al.

[11] Patent Number: 5,685,960
[45] Date of Patent: Nov. 11, 1997

[54] METHOD FOR FORMING ALUMINUM CONTACTS

[75] Inventors: Jianming Fu, Sunnyvale; Zheng Xu, Foster City, both of Calif.

[73] Assignee: Applied Materials, Inc., Santa Clara, Calif.

[21] Appl. No.: 563,167

[22] Filed: Nov. 27, 1995

[51] Int. Cl.$^6$ .............................. C23C 14/34; A01L 21/44
[52] U.S. Cl. ............................... 204/192.3; 204/192.17; 437/192; 437/194
[58] Field of Search ......................... 204/192.17, 192.3; 437/194, 192

[56] References Cited

U.S. PATENT DOCUMENTS 5,378,660  1/1995  Ngan et al. .......................... 437/247

FOREIGN PATENT DOCUMENTS 2-291124  11/1990  Japan ................................. 204/192.17
4280425  10/1992  Japan ................................. 204/192.17

OTHER PUBLICATIONS

Park et al, "A Novel Al–Reflow Process Using Surface Modification by the ECR Plasma Treatment and its Application to the 256Mbit DRAM", IEDM Technical Digest 1994, San Francisco, CA Dec. 11–14, 1994, pp. 5.4.1–5.4.4.

*Primary Examiner*—Aaron Weisstuch
*Attorney, Agent, or Firm*—Donald Verplancken; Birgit E. Morris

[57] ABSTRACT

A process for making an aluminum contact comprising sputter depositing in a contact opening in a semiconductor substrate a first layer of titanium, forming a thin layer of titanium oxide thereover, sputter depositing a titanium nitride layer, smoothing the titanium nitride layer in an argon plasma, and sputter depositing an aluminum contact over the treated titanium nitride layer. The argon plasma treatment smooths the surface of the titanium nitride layer and improves the wettability between this layer and aluminum.

3 Claims, 1 Drawing Sheet

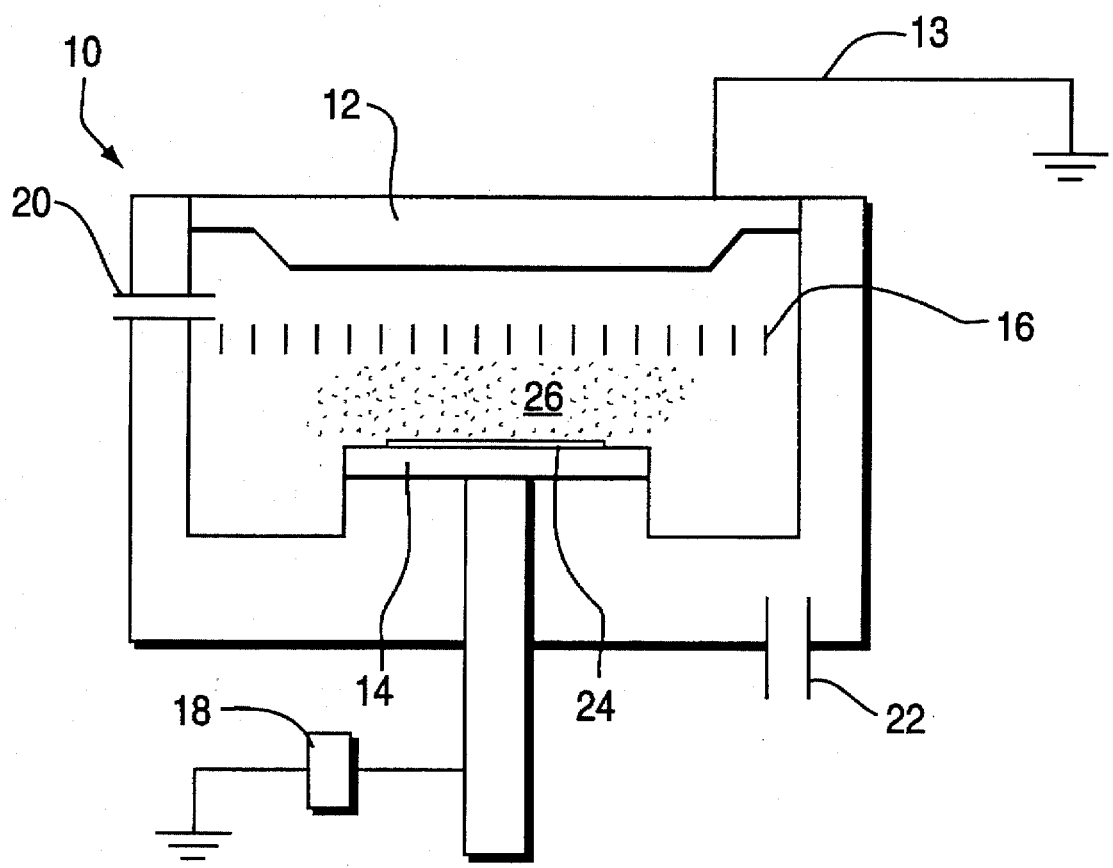

5,685,960

METHOD FOR FORMING ALUMINUM CONTACTS

This invention relates to an improved method for forming aluminum contacts in contact openings in a semiconductor substrate. More particularly, this invention is directed to improving the wettability of an aluminum contact layer to underlying titanium nitride barrier layers.

BACKGROUND OF THE INVENTION

Titanium nitride (TiN) is a known barrier material used to prevent spiking of aluminum contacts into a semiconductor substrate such as a silicon wafer. TiN can be deposited by sputtering a titanium target in the presence of nitrogen and argon gases. It is also known to improve the barrier properties of TiN by adding oxygen to the TiN film. The oxygen fills the spaces between grain boundaries of TiN. This can be done by annealing in the presence of oxygen and nitrogen, or oxygen can be added during sputtering.

Barrier layer properties have been further improved by depositing a first titanium layer prior to forming the oxygenated TiN layer.

The sputtered TiN layer itself however is quite rough, and the subsequently sputter deposited layer of aluminum does not wet the rough TiN surface well. Titanium alone is a good wetting material for aluminum, and thus it has been suggested to deposit a titanium layer over the sputter deposited oxygenated TiN layer. Unfortunately, this titanium layer increases the contact resistance.

Thus it would be desirable to improve the wettability between sputtered oxygenated TiN layers and an overlying aluminum layer without depositing a layer of titanium in between.

SUMMARY OF THE INVENTION

We have found that the wettability between a sputtered oxygenated TiN barrier layer and an overlying aluminum layer can be improved by treatment of the TiN layer with an argon plasma. The argon plasma is formed by flowing argon gas to the sputtering chamber and applying RF power to the substrate support electrode. The resulting self-bias will modify the rough surface of the sputtered oxygenated TiN film, and improve the wettability between the TiN barrier layer and a sputtered overlying aluminum layer.

BRIEF DESCRIPTION OF THE DRAWING

FIG. 1 is a schematic view of a sputtering chamber in which the present process can be carried out.

DETAILED DESCRIPTION OF THE INVENTION

In accordance with the process of the present invention, aluminum contacts are formed in the following sequential steps in an opening formed for that purpose:
   a) sputter depositing a titanium layer;
   b) treating the titanium layer with oxygen, or oxygen and nitrogen, to form a thin surface layer of $TiO_x$ or TiON;
   c) sputter depositing a TiN layer and oxygenating the layer;
   d) treating the TiN layer with an argon plasma; and
   e) sputter depositing aluminum over the treated TiN layer.

FIG. 1 is a schematic view of a conventional sputtering chamber modified to permit formation of an argon or oxygen plasma between depositions of titanium and titanium nitride barrier layers. Referring to FIG. 1, a sputtering chamber 10 includes, a titanium target 12 connected to a DC power source 13 and a substrate support 14. A collimator 16 is mounted between the target 12 and the substrate support 14. A source of RF power 18, is connected to the substrate support 14. A gas inlet port 20 permits various gases to be controllably passed into the chamber 10. An exhaust port 22 removes excess and by-product gases from the chamber 10 and maintains the desired pressure in the chamber. During processing, a substrate 24 is mounted on the substrate support 14. A plasma 26 may be generated above the substrate 24.

The substrate, such as a silicon wafer, will have a plurality of high aspect ratio openings, generally in a dielectric layer, into which the aluminum contacts may be formed in the following manner.

A first titanium layer is sputter deposited in argon onto a substrate, usually a silicon wafer, in a sputtering chamber as shown in FIG. 1 fitted with a DC power source connected to a titanium target. This titanium layer is generally deposited at a high DC power of 10,000–12,000 watts, whereby titanium is deposited at a deposition rate of about 1000 Å/min. A source of RF power is connected to the substrate support. After deposition of this first titanium layer, an oxygen-containing gas, such as mixtures of oxygen and argon that can also contain nitrogen, is flowed into the chamber and the RF power is turned on to create a plasma of the plasma precursor gases in the sputtering chamber. The generated oxygen plasma will form a layer of $TiO_x$, or $TiO_xN_y$ when nitrogen is added.

Alternatively, in addition to the RF power applied, a low DC power of about 500 watts can also be applied to the target during this step. The titanium is sputtered in the presence of an oxygen plasma at a low deposition rate. This also forms a thin (about 20 Å thick) titanium oxide or titanium oxynitride layer over the first titanium layer.

This titanium oxide or titanium oxynitride layer can also be prepared in the absence of RF power.

Thus the plasma deposition of the titanium oxide or oxynitride layer is controlled by adjusting the DC and RF power supplies, and by adjusting the gas flows and gas flow rates.

The oxygen plasma is discontinued when a titanium oxide layer up to about 20 Å in thickness has been formed over the titanium layer. This thin oxide layer does not adversely affect the resistance of the subsequently deposited titanium nitride layer or the resistance of the aluminum contact, but does improve the robustness of the barrier layer.

The process can then be continued in the same sputtering chamber by shutting off the RF power and depositing titanium nitride by sputtering the titanium target in the presence of nitrogen, generally a mixture of nitrogen and argon, in known manner.

After deposition of the desired thickness of the TiN layer, and in the same sputtering chamber, the surface of the TiN layer is smoothed to improve the wettability of a subsequently deposited aluminum layer using an argon plasma. The argon plasma is initiated by turning the RF power on and establishing a flow of argon into the sputtering chamber. RF power is initiated to the substrate support electrode. This RF power to the substrate support provides an induced self bias that attracts argon ions, to cause ion bombardment of the substrate and smoothing of the TiN surface. This improves the wettability between the sputtered TiN and aluminum, and can lead to improved filling of the openings by the aluminum layer.

A major advantage of the present process is that all of the above steps can be carried out in a single sputtering chamber. Thus the substrate does not need to be transferred to different chambers during the depositions and treatment of the titanium and titanium nitride layers.

The substrate is then transferred to an aluminum sputtering chamber for the deposition of aluminum over the plasma treated TiN surface, which is now wettable by the aluminum. The deposition of aluminum can also be carried out in the original sputtering chamber, but a change of targets from titanium to aluminum will then be required, and is not preferred. The aluminum can be sputter deposited in known manner.

The present process thus provides a process sequence that deposits TiN, treats the TiN with an argon plasma, and sputter deposits aluminum, and avoids the need for depositing a titanium film between the TiN and the aluminum that increases the contact resistance.

Various modifications of the above process will be apparent to those skilled in the art and are meant to be included herein. For example, the substrate can be transferred to other chambers between processing steps, and various process parameters are known and can be used for depositing the overlying aluminum layer. The invention is only meant to be limited by the scope of the appended claims.

We claim:

1. A process for forming aluminum contacts which comprises the following sequential steps:
   a) sputter depositing a titanium layer onto a semiconductor substrate having a plurality of openings therein;
   b) forming an oxygen-containing titanium layer over the titanium layer;
   c) sputter depositing a titanium nitride layer over the oxygen-containing titanium layer;
   d) treating the surface of the titanium nitride layer with a plasma of argon to smooth said surface, all of the steps a) to d) being performed in the same sputtering chamber; and
   e) sputter depositing an aluminum layer over the plasma treated titanium nitride layer.

2. A process according to claim 1 wherein during step d) an RF power supply is connected to the substrate support, thereby inducing a self bias to the substrate.

3. A process according to claim 1 wherein step e) is performed in a second sputtering chamber.

* * * * *